United States Patent
Ninomiya et al.

(10) Patent No.: US 10,667,395 B2
(45) Date of Patent: May 26, 2020

(54) INTERPOSER SUBSTRATE AND MULTILAYER PRINTED SUBSTRATE

(71) Applicant: Toshiba Electronic Devices & Storage Corporation, Minato-ku, Tokyo (JP)

(72) Inventors: Ryoji Ninomiya, Kunitachi Tokyo (JP); Kenichi Agawa, Yokohama Kanagawa (JP)

(73) Assignee: Toshiba Electronic Devices & Storage Corporation, Tokyo (JP)

(*) Notice: Subject to any disclaimer, the term of this patent is extended or adjusted under 35 U.S.C. 154(b) by 0 days.

(21) Appl. No.: 16/126,513

(22) Filed: Sep. 10, 2018

(65) Prior Publication Data

US 2019/0223290 A1 Jul. 18, 2019

(30) Foreign Application Priority Data

Jan. 16, 2018 (JP) .................. 2018-004773

(51) Int. Cl.
| | |
|---|---|
| *H05K 1/14* | (2006.01) |
| *H01L 23/498* | (2006.01) |
| *H05K 3/36* | (2006.01) |
| *H05K 3/32* | (2006.01) |

(52) U.S. Cl.
CPC ....... *H05K 1/144* (2013.01); *H01L 23/49822* (2013.01); *H05K 3/368* (2013.01); *H05K 3/323* (2013.01); *H05K 2201/041* (2013.01); *H05K 2201/10378* (2013.01)

(58) Field of Classification Search
CPC ........ H05K 1/144; H05K 3/368; H05K 3/323; H05K 2201/041; H05K 2201/10378; H01L 23/49822
USPC .......................................... 174/255
See application file for complete search history.

(56) References Cited

U.S. PATENT DOCUMENTS

RE44,251 E * 6/2013 Asai .................. H05K 1/112
174/260

FOREIGN PATENT DOCUMENTS

| JP | 59-161892 A | 9/1984 |
|---|---|---|
| JP | 61-147699 A | 7/1986 |
| JP | 2011-133431 A | 7/2011 |

* cited by examiner

*Primary Examiner* — Tremesha S Willis
(74) *Attorney, Agent, or Firm* — White & Case LLP

(57) ABSTRACT

According to one embodiment, an interposer substrate for switching wiring lines, includes a substrate body having through holes penetrating from a first main surface thereof to a second main surface, through-conductive portions provided respectively in the through holes, grouped into first groups and second groups different from the first groups, first wiring lines each provided on the first main surface and for a respective one of the first groups, second wiring lines each provided on the second main surface and for a respective one of the second groups, first terminals provided on the first main surface and connected respectively to the first wiring lines, and second terminals provided on the second main surface and connected respectively to the second wiring lines.

14 Claims, 6 Drawing Sheets

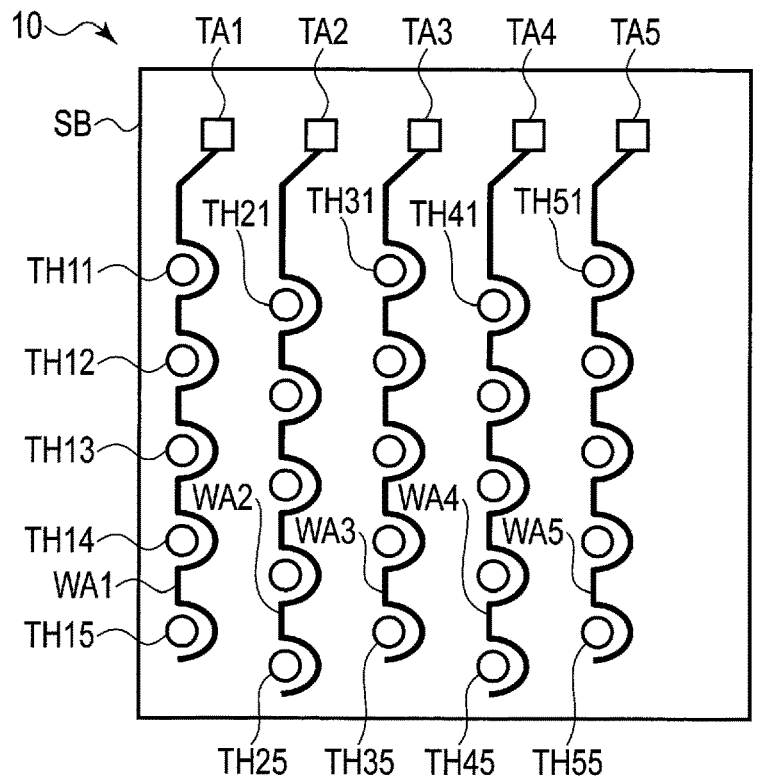
F I G. 1
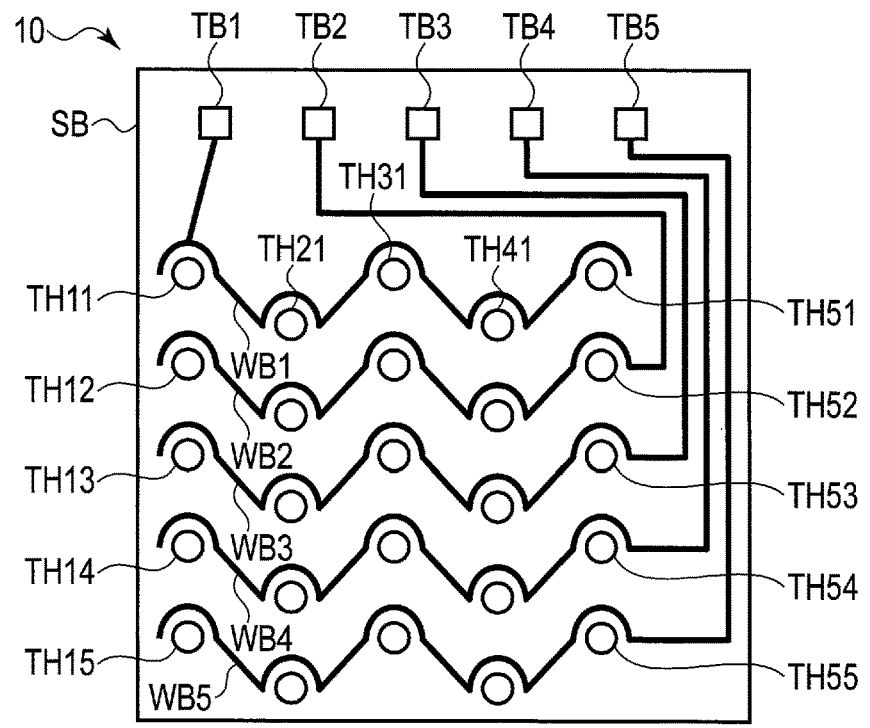
F I G. 2

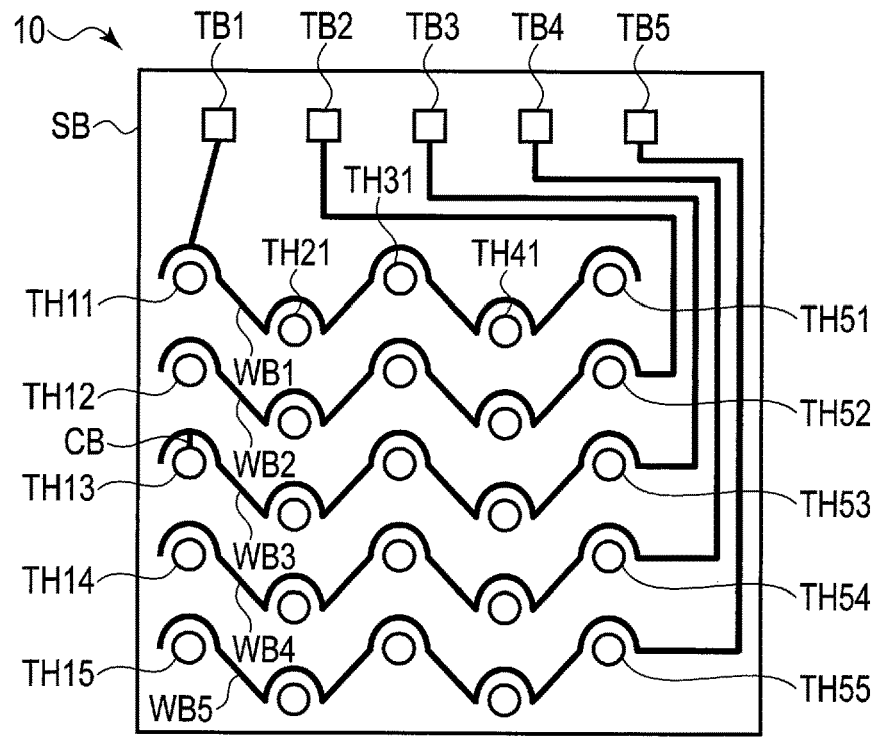
F I G. 7
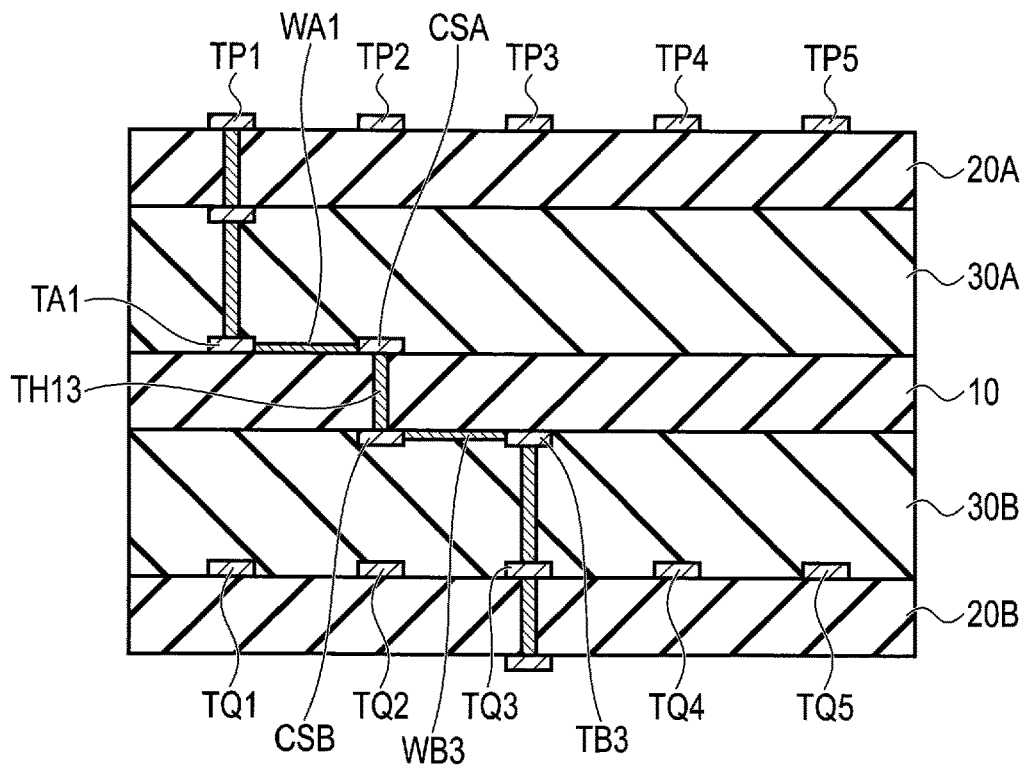
F I G. 8

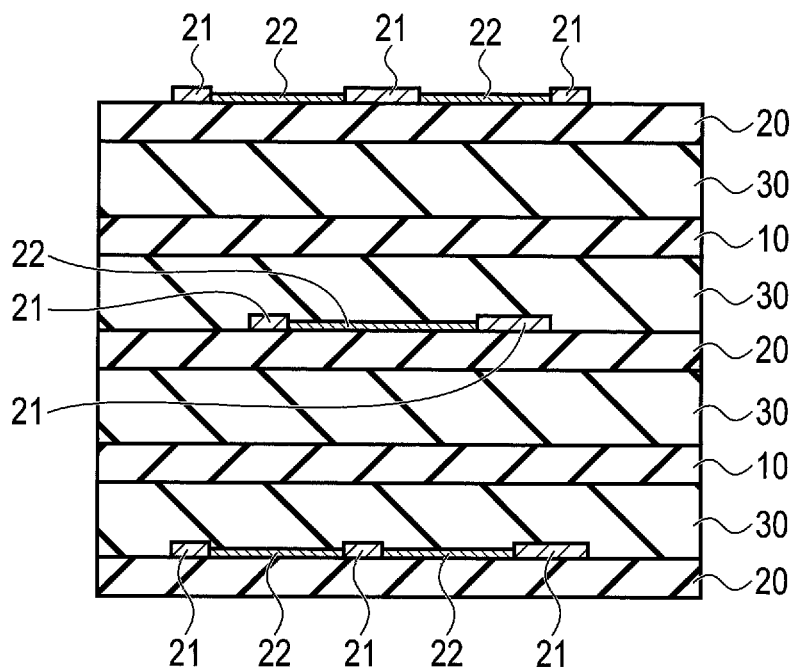
F I G. 9
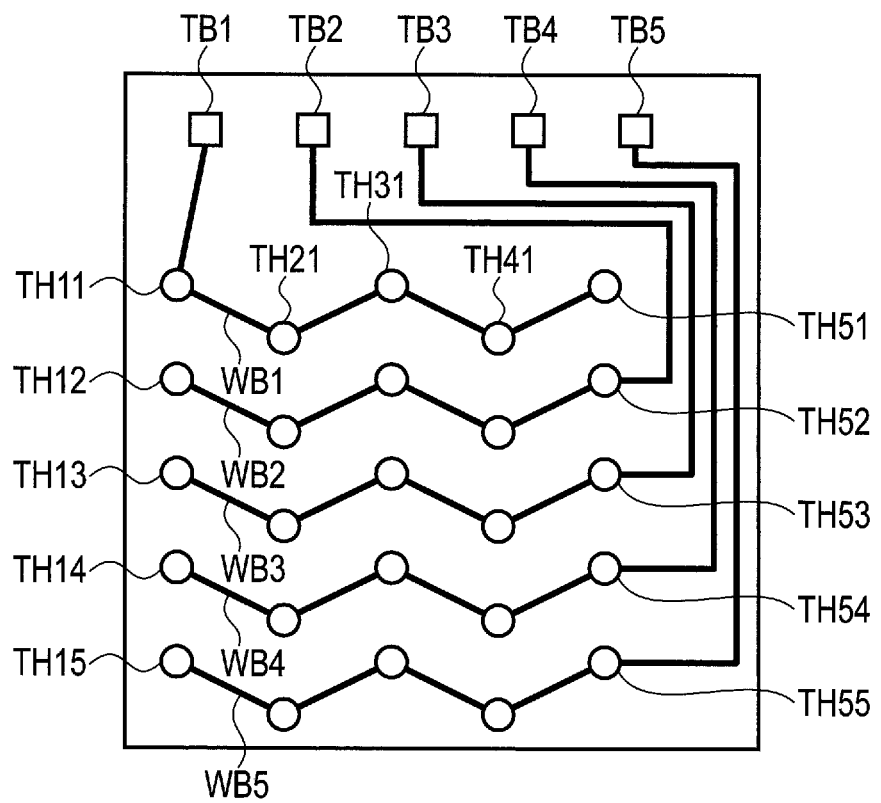
F I G. 10

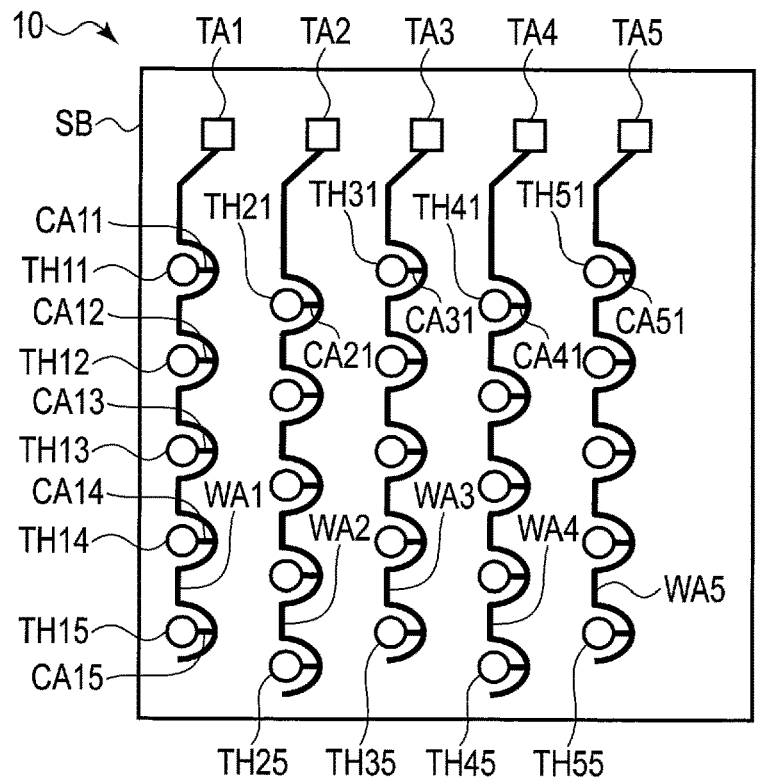
F I G. 11
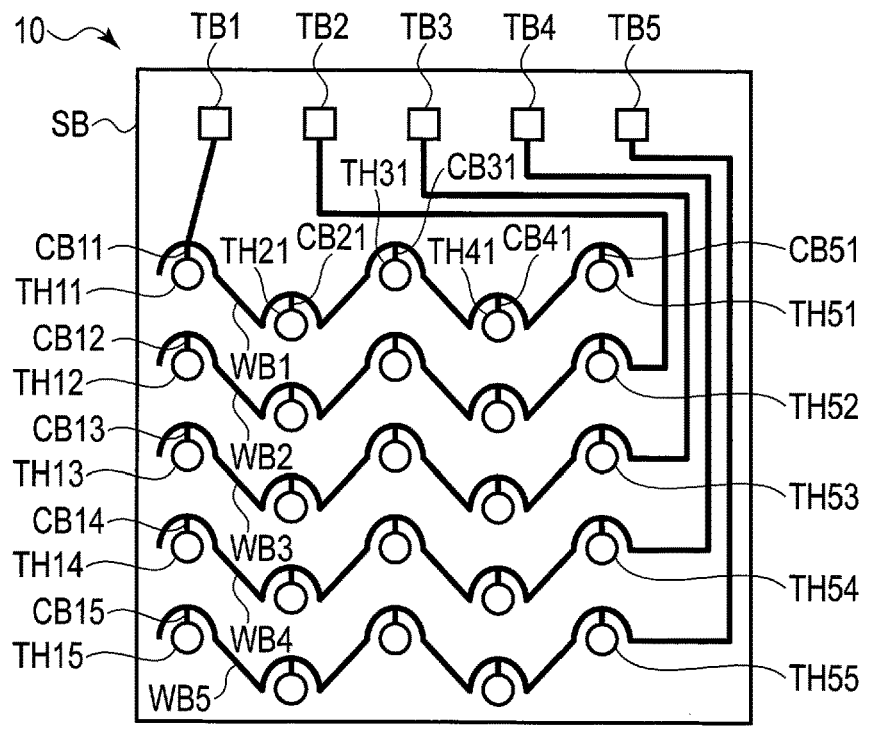
F I G. 12

INTERPOSER SUBSTRATE AND MULTILAYER PRINTED SUBSTRATE

CROSS-REFERENCE TO RELATED APPLICATIONS

This application is based upon and claims the benefit of priority from Japanese Patent Application No. 2018-004773, filed Jan. 16, 2018, the entire contents of which are incorporated herein by reference.

FIELD

Embodiments described herein relate generally to an interposer substrate and a multilayer printed substrate.

BACKGROUND

A multilayer printed substrate in which a plurality of small-sized printed substrates are stacked on one another has been developed. This multilayer printed substrate includes small-sized printed substrates, and therefore there are a few terminals and the terminal positions are standardized. With this structure, between adjacent printed substrates, the terminals disposed at corresponding terminal positions cannot be used for different purposes.

Under these circumstances, there has been a demand of an interposer substrate and a multilayer printed substrate, which enable terminals arranged at corresponding terminal positions to be used for different purposes.

BRIEF DESCRIPTION OF THE DRAWINGS

FIG. 1 is a plan view schematically showing a structure of a first main surface of an interposer substrate according to a first embodiment.

FIG. 2 is a plan view schematically showing a structure of a second main surface of the interposer substrate according to the first embodiment.

FIG. 7 is a plan view schematically showing the structure of the second main surface of the interposer substrate according to the first embodiment when a wiring line and a through-conductive portion are connected to each other by a solder portion.

FIG. 8 is a diagram schematically showing a structure of the first embodiment when two printed substrates are stacked via an interposer substrate.

FIG. 9 is a diagram schematically showing a structure of a multilayer printed substrate according to the first embodiment, in which an interposer substrate, a printed substrate and an anisotropically conductive member are stacked.

FIG. 10 is a plan view schematically showing a modified example of the structure of the second main surface of the interposer substrate according to the first embodiment.

FIG. 11 is a plan view schematically showing a structure of a first main surface of an interposer substrate according to a second embodiment.

FIG. 12 is a plan view schematically showing a structure of a second main surface of the interposer substrate according to the second embodiment.

DETAILED DESCRIPTION

Figure 3:
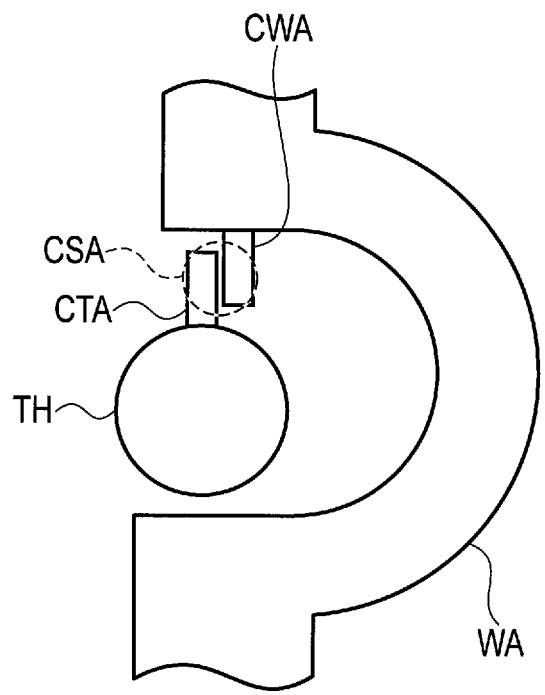
FIG. 3 is a partially enlarged plan view of FIG. 1 according to the first embodiment.

In general, according to one embodiment, an interposer substrate for switching wiring lines, includes: a substrate body having a plurality of through holes penetrating from a first main surface thereof to a second main surface; a plurality of through-conductive portions provided respectively in the plurality of through holes, grouped into a plurality of first groups and a plurality of second groups different from the first groups; a plurality of first wiring lines each provided on the first main surface and for a respective one of the plurality of first groups; a plurality of second wiring lines each provided on the second main surface and for a respective one of the plurality of second groups; a plurality of first terminals provided on the first main surface and connected respectively to the plurality of first wiring lines; and a plurality of second terminals provided on the second main surface and connected respectively to the plurality of second wiring lines.

Embodiments will now be described with reference to the accompanying drawings.

First Embodiment

FIG. 1 is a plan view schematically showing a structure of a first main surface of an interposer substrate according to a first embodiment. FIG. 2 is a plan view schematically showing a structure of a second main surface of the interposer substrate according to the first embodiment.

An interposer substrates 10 shown in FIGS. 1 and 2 comprises a substrate body SB, a plurality of through-conductive portions THxy (x=1 to 5 and y=1 to 5 in the example shown in FIGS. 1 and 2), a plurality of first wiring lines WAm (m=1 to 5 in the example shown in FIGS. 1 and 2), a plurality of second wiring lines WBn (n=1 to 5 in the example shown in FIGS. 1 and 2), a plurality of first terminals TAm (m=1 to 5 in the example shown in FIGS. 1 and 2), and a plurality of second terminals TBn (n=1 to 5 in the example shown in FIGS. 1 and 2).

The substrate body SB comprises a plurality of through holes penetrating from a first main surface (surface shown in FIG. 1) to a second main surface (surface shown in FIG. 2).

In the through-holes described above, a plurality of through-conductive portions THxy are formed, respectively. Thus, the through-conductive portions THxy penetrate the substrate body SB. The through-conductive portions THxy are arranged in a grid.

The through-conductive portions THxy are grouped into a plurality of first groups and also a plurality of second groups. In the example shown in FIGS. 1 and 2, one first group is formed of five through-conductive portions THxy arranged along a perpendicular direction. More specifically, the through-conductive portions THxy are grouped into five first groups of TH11 to TH15, TH21 to TH25, TH31 to TH35, TH41 to TH45 and TH51 to TH55. On the other hand, one second group is formed of five through-conductive portions THxy arranged in a horizontal direction. More specifically, the through-conductive portions THxy are grouped into five second groups of TH11 to TH51, TH12 to TH52, TH13 to TH53, TH14 to TH54 and TH15 to TH55.

As shown in FIG. 1, a plurality of first wiring lines WA1 to WA5 are formed on the first main surface of the substrate body SB. As shown in FIG. 2, a plurality of second wiring lines WB1 to WB5 are formed on the second main surface of the substrate body SB. The first wiring lines WA1 to WA5 each extend along a perpendicular direction. The second wiring lines WB1 to WB5 each extend along a horizontal direction. Therefore, as viewed from a perpendicular direction to the first main surface and the second main surface, the first wiring lines WA1 to WA5 and the second wiring lines WB1 to WB5 cross each other.

As shown in FIG. 1, the first wiring lines WA1 to WA5 are provided respectively for the first groups. More specifically, the first wiring line WA1 is provided for the through-conductive portions TH11 to TH15, the first wiring line WA2 for the through-conductive portions TH21 to TH25, the first wiring line WA3 for the through-conductive portions TH31 to TH35, the first wiring line WA4 for the through-conductive portions TH41 to TH45, and the first wiring line WA5 for the through-conductive portions TH51 to TH55.

As shown in FIG. 2, the second wiring lines WB1 to WB5 are provided respectively for the second groups. More specifically, the second wiring line WB1 is provided for the through-conductive portions TH11 to TH51, the second wiring line WB2 for the through-conductive portions TH12 to TH52, the second wiring line WB3 for the through-conductive portions TH13 to H53, the second wiring line WB4 for the through-conductive portions TH14 to TH54, and the second wiring line WB5 for the through-conductive portions TH15 to TH55.

In this embodiment, the first wiring lines WA1 to WA5 are not electrically connected to the through-conductive portions THxy contained in the respective corresponding groups. Moreover, in this embodiment, the second wiring lines WB1 to WB5 are not electrically connected to the through-conductive portions THxy contained in the respective corresponding groups.

As shown in FIG. 1, the first wiring lines WA1 to WA5 are connected respectively to the first terminals TA1 to TA5 which are provided on the first main surface of the substrate body SB. As shown in FIG. 2, the second wiring lines WB1 to WB5 are respectively connected to the second terminals TB1 to TB5 which are provided on the second main surface of the substrate body SB. As viewed from a perpendicular direction to the first main surface and the second main surface, and the first terminals TA1 to TA5 and the second terminals TB1 to TB5 are respectively located at the same positions.

FIG. 3 is a partially expanded plan view of FIG. 1. As shown in FIG. 3, a connection portion (connection pattern) CTA is connected to a through-conductive portion TH, and a connection portion (connection pattern) CWA is connected to a first wiring line WA. The connection portion CTA and the connection portion CWA are apart from each other. However, as will be described later, when stacking two printed substrates one on another via the interposer substrate 10 of this embodiment, the connection portion CTA connected to the desired through-conductive portion TH and the connection portion CWA connected to the desired first wiring line WA are connected to each other by a solder portion CSA.

Figure 4:
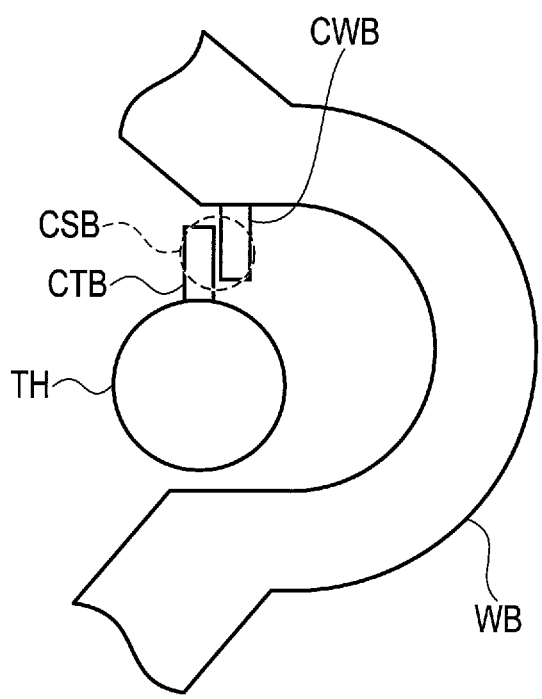
FIG. 4 is a partially enlarged plan view of FIG. 2 according to the first embodiment.

FIG. 4 is a partially expanded plan view of FIG. 2. As shown in FIG. 4, a connection portion (connection pattern) CTB is connected to a through-conductive portion TH, and a connection portion (connection pattern) CWB is connected to a first wiring line WB. The connection portion CTB and the connection portion CWB are apart from each other. However, as will be described later, when stacking two printed substrates one on another via the interposer substrate 10 of this embodiment, the connection portion CTB connected to the desired through-conductive portion TH and the connection portion CWB connected to the desired first wiring line WA are connected to each other by a solder portion CSB.

Figure 5:
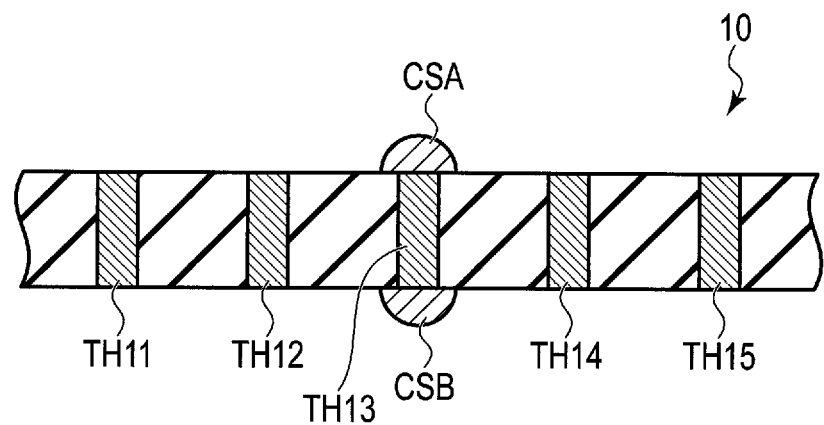
FIG. 5 is a cross section schematically showing a structure of the first embodiment, when solder portions are provided in one end and another end of a through-conductive portion.

FIG. 5 is a cross section schematically showing a structure when the solder portion CSA is provided in one end portion (on a first main surface end side) of a through-conductive portion (for example, through-conductive portion 13) and the solder portion CSB is provided in another end portion (on a second main surface side) of a through-conductive portion (for example, through-conductive portion 13). In this case, the wiring line WA1 and the through-conductive portion 13 are connected to each other by the solder portion CSA, and the wiring line WB3 and the through-conductive portion 13 are connected by the solder portion CSB. As a result, the wiring line WA1 and the wiring line WB3 are electrically connected to each other through the through-conductive portion 13. A terminal TA1 is connected to the wiring line WA1 and a terminal TB3 is connected to the wiring line WB3. Thus, the terminal TA1 and the terminal TB3 are electrically connected to each other.

Figure 6:
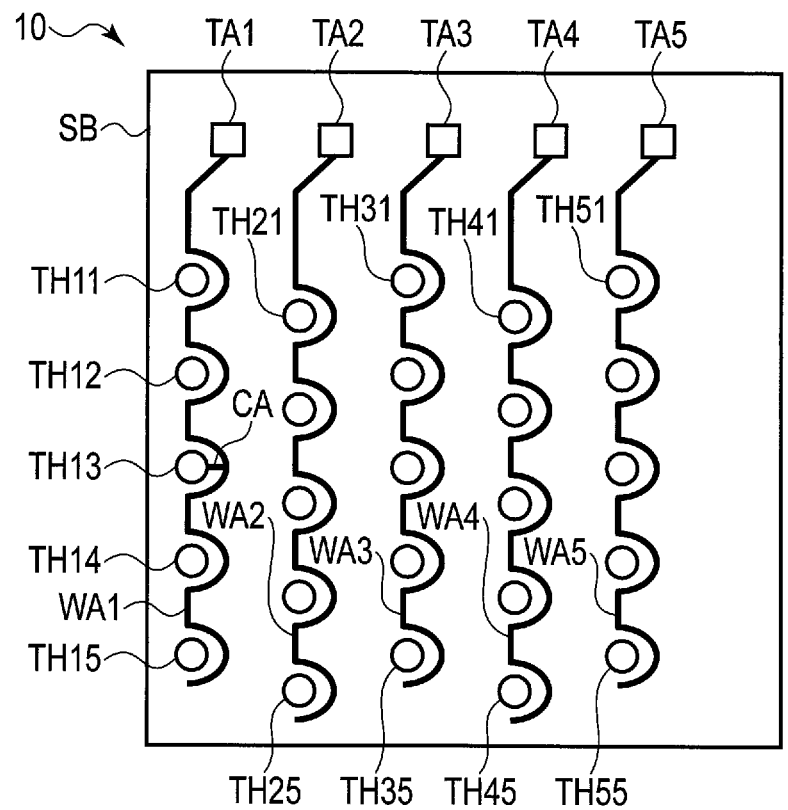
FIG. 6 is a plan view schematically showing the structure of the first main surface of the interposer substrate according to the first embodiment when a wiring line and a through-conductive portion are connected to each other by a solder portion.

FIG. 6 is a plan view schematically showing a structure of the first main surface of the interposer substrate 10 when a wiring line (for example, wiring line WA1) and a through-conductive portion (for example, through-conductive portion 13) are connected to each other by a connection portion CA. FIG. 7 is a plan view schematically showing a structure of the second main surface of the interposer substrate 10 when a wiring line (for example, wiring line WB3) and a through-conductive portion (for example, through-conductive portion 13) are connected to each other by a connection portion CB.

FIG. 8 is a diagram schematically showing a structure in which two printed substrates 20A and 20B are stacked via the interposer substrate 10 described above.

Terminals (third terminals) TP1 to TP5 are formed on a printed substrate 20A, and terminals (fourth terminals) TQ1 to TQ5 are formed on a printed substrate 20B. FIG. 8 show an example of the state when the terminal TP1 and the terminal TQ3 are connected to each other via the interposer substrate 10 described above. Between the printed substrate 20A and the interposer substrate 10, an anisotropically conductive connection member 30A is provided, and between the printed substrate 20B and the interposer substrate 10, an anisotropically conductive connection member 30B is provided. The anisotropically conductive connection members are able to secure conductivity in a vertical direction, but not in a horizontal direction. Therefore, by the connection member 30A, the terminal TP1 of the printed substrate 20A and the terminal TA1 of the interposer substrate 10 can be electrically connected to each other, whereas by the connection member 30B, the terminal TQ3 of the printed substrate 20B and the terminal TB3 of the interposer substrate 10 can be electrically connected to each other. In order for the structure to be easily understandable, FIG. 8 provides a schematic illustration of the electrical connection paths of the connection members 30A and 30B.

The terminal TA1 on the first main surface of the interposer substrate 10 and the terminal TB3 on the second main surface of the interposer substrate 10 are electrically connected to each other by the first wiring line WA1, the solder portion CSA, the through-conductive portion TH13, the solder portion CSB and the second wiring line WB3. Thus, as shown in FIG. 8, the terminal TP1 of the printed substrate 20A and the terminal TQ3 of the printed substrate 20B can be electrically connected to each other.

Let us suppose that the interposer substrate 10 is not interposed but only a connection member is between the printed substrate 20A and the printed substrate 20B. In this case, the connection relationship between the terminals of the printed substrate 20A and the terminals of the printed substrate 20B is univocally determined. That is, the terminals TP1, TP2, TP3, TP4 and TP5 are connected respectively to terminals TQ1, TQ2, TQ3, TQ4 and TQ5, provided at the corresponding positions.

With use of the interposer substrate 10 of this embodiment, it becomes possible to set desired connection relationships between the terminals of the printed substrate 20A and the terminals of the printed substrate 20B. Therefore, the terminals allocated at corresponding positions between adjacent printed substrates can be used for different purposes. Thus, if the terminal positions are standardized in a multilayer printed substrate in which a plurality of small printed substrates are stacked one on another, it is still possible to set a desired connection relationship of the terminals between adjacent printed substrates.

FIG. 9 is a diagram schematically showing a structure of a multilayer printed substrate in which the interposer substrate 10, the printed substrate 20 and the anisotropically conductive member 30, described above are stacked one on another. The printed substrate 20 is provided with electronic parts 21, circuit patterns 22 and the like. With use of the interposer substrate 10 configured as above, the electronic parts 21, circuit patterns 22 and the like can be appropriately connected to each other between the multilayer printed substrates 20.

FIG. 10 is a plan view schematically showing a modified example of the structure of the second main surface of the interposer substrate according to the first embodiment. In this modified example, wiring lines WB are electrically connected to through-conductive portions TH in advance. The first main surface is similar to that of the embodiment described above. As described, on one main surface (the second main surface in the example shown in FIG. 10), the wiring lines WB may be electrically connected to the through-conductive portions TH in advance.

Second Embodiment

Next, a second embodiment will be described. Since basic elements are similar to those of the first embodiment, the descriptions of the elements already explained in the first embodiment will be omitted.

FIG. 11 is a plan view schematically showing a structure of a first main surface of an interposer substrate according to the second embodiment. FIG. 12 is a plan view schematically showing a structure of a second main surface of the interposer substrate according to the second embodiment.

In this embodiment, first wiring lines WA1 to WA5 are electrically connected to through-conductive portions THxy of respective corresponding groups by respective connection portions CAxy. More specifically, the first wiring line WA1 is connected to the through-conductive portions TH11 to TH15 by the connection portions CA11 to CA15, respectively. The first wiring line WA2 is connected to the through-conductive portions TH21 to TH25 by the connection portions CA21 to CA25, respectively. The first wiring line WA3 is connected to the through-conductive portions TH31 to TH35 by the connection portions CA31 to CA35, respectively. The first wiring line WA4 is connected to the through-conductive portions TH41 to TH45 by the connection portions CA41 to CA45, respectively. The first wiring line WA5 is connected to the through-conductive portions TH51 to TH55 by the connection portions CA51 to CA55, respectively.

In this embodiment, the second wiring lines WB1 to WB5 are each electrically connected to the through-conductive portions THxy contained in the respective corresponding groups by the respective connection portions CAxy. More specifically, the second wiring line WB1 is connected to the through-conductive portions TH11 to TH51 by the connection portions CB11 to CB51, respectively. The second wiring line WB2 is connected to the through-conductive portions TH12 to TH52 by the connection portions CB12 to CB52, respectively. The second wiring line WB3 is connected to the through-conductive portions TH13 to TH53 by the connection portions CB13 to CB53, respectively. The second wiring line WB4 is connected to the through-conductive portions TH14 to TH54 by the connection portions CB14 to CB54, respectively. The second wiring line WB5 is connected to the through-conductive portions TH15 to TH55 by the connection portions CB15 to CB55, respectively.

In this embodiment, only in required portions, first wiring lines WA and through-conductive portions TH are connected by connection portions CA, whereas wiring lines WB and second through-conductive portions TH are connected by connection portions CB. In the portions need not be connected, connection portions CA and connection portions CB are disconnected respectively from each other by laser or the like.

Even with the structure described above, it is possible to set a desired connection relationship between the terminals TP1 to TP5 of the printed substrate 20A and the terminals TQ1 to TQ5 of the printed substrate 20B as in the case of the structure of the first embodiment, shown in FIG. 8. Therefore, an advantageous effect similar to that of the first embodiment can be obtained also in this embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An interposer substrate for switching wiring lines, comprising: a substrate body having a plurality of through holes penetrating from a first main surface thereof to a second main surface; a plurality of through-conductive portions provided respectively in the plurality of through holes, grouped into a plurality of first groups and a plurality of second groups different from the first groups, each of all the through-conductive portions belonging to a corresponding one of the first groups and a corresponding one of the second groups; a plurality of first wiring lines each provided on the first main surface, each provided for a respective one of the plurality of first groups, and each including a portion extending along the through-conductive portions included in the respective one of the first groups; a plurality of second wiring lines each provided on the second main surface, each provided for a respective one of the plurality of second groups, and each including a portion extending along the through-conductive portions included in the respective one of the second groups; a plurality of first terminals provided on the first main surface and connected respectively to the plurality of first wiring lines; and a plurality of second terminals provided on the second main surface and connected respectively to the plurality of second wiring lines, wherein any through-conductive portion and any first wiring line, which is provided for a first group to which the any through-conductive portion belongs, are electrically connectable to each other by a first connection structure provided on the first main surface, and the first connection structure includes a first connection portion projecting from the any through-conductive portion and a second connection portion projecting from the any first wiring line, and wherein none of the through-conductive portions is directly electrically connected to any one of the first wiring lines.

2. The substrate of claim 1, wherein
the plurality of through-conductive portions are arranged in a grid.

3. The substrate of claim 1, wherein
the first wiring lines and the second wiring lines cross each other as viewed from a direction perpendicular to the first main surface and the second main surface.

4. The substrate of claim 1, wherein
the first terminals and the second terminals are located at same positions, respectively, as viewed from a direction perpendicular to the first main surface and the second main surface.

5. A multilayer printed substrate comprising:
an interposer substrate for switching wiring lines, comprising:
a substrate body having a plurality of through holes penetrating from a first main surface thereof to a second main surface;
a plurality of through-conductive portions provided respectively in the plurality of through holes, grouped into a plurality of first groups and a plurality of second groups different from the first groups, each of all the through-conductive portions belonging to a corresponding one of the first groups and a corresponding one of the second groups;
a plurality of first wiring lines each provided on the first main surface each provided for a respective one of the plurality of first groups, and each including a portion extending along the through-conductive portions included in the respective one of the first groups;
a plurality of second wiring lines each provided on the second main surface each provided for a respective one of the plurality of second groups, and each including a portion extending along the through-conductive portions included in the respective one of the second groups;
a plurality of first terminals provided on the first main surface and connected respectively to the plurality of first wiring lines;
a plurality of second terminals provided on the second main surface and connected respectively to the plurality of second wiring lines;
a first printed substrate having a plurality of third terminals electrically connected respectively to the plurality of first terminals; and
a second printed substrate having a plurality of fourth terminals electrically connected respectively to the plurality of second terminals,
wherein the interposer substrate is provided between the first printed substrate and the second printed substrate, and
wherein a predetermined one of the through-conductive portions and a predetermined one of the first wiring lines, which is provided for a predetermined one of the first groups to which the predetermined through-conductive portion belongs, are electrically connected to each other by a first connection structure provided on the first main surface, the first connection structure includes a first connection portion projecting from the predetermined through-conductive portion and a second connection portion projecting from the predetermined first wiring line, and the through-conductive portions, other than the predetermined through-conductive portion, which are included in the predetermined first group are not electrically connected to the predetermined first wiring line.

6. The substrate of claim 5, further comprising:
a first connection member interposed between the first terminals and the third terminals; and
a second connection member interposed between the second terminals and the fourth terminals.

7. The substrate of claim 5, wherein
the plurality of through-conductive portions are arranged in a grid.

8. The substrate of claim 5, wherein
the first wiring lines and the second wiring lines cross each other as viewed from a direction perpendicular to the first main surface and the second main surface.

9. The substrate of claim 5, wherein
the first terminals and the second terminals are located at same positions, respectively, as viewed from a direction perpendicular to the first main surface and the second main surface.

10. The substrate of claim 1, wherein
any one of the first wiring lines is not electrically connected to any one of the second wiring lines.

11. The substrate of claim 1, wherein the any through-conductive portion and any second wiring line, which is provided for a second group to which the any through-conductive portion belongs, are electrically connectable to each other by a second connection structure provided on the second main surface, and the second connection structure includes a third connection portion projecting from the any through-conductive portion and a fourth connection portion projecting from the any second wiring line, and none of the through-conductive portions is directly electrically connected to any one of the second wiring lines.

12. The substrate of claim 1, wherein
the number of the through-conductive portions included in each of the first groups and the number of the through-conductive portions included in each of the second groups are equal to each other.

13. The substrate of claim 5, wherein
the predetermined one of the through-conductive portions and a predetermined one of the second wiring lines, which is provided for a predetermined one of the second groups to which the predetermined through-conductive portion belongs, are electrically connected to each other by a second connection structure provided on the second main surface, the second connection structure includes a third connection portion projecting from the predetermined through-conductive portion and a fourth connection portion projecting from the predetermined second wiring line, and the through-conductive portions, other than the predetermined through-conductive portion, which are included in the predetermined second group are not electrically connected to the predetermined second wiring line.

14. The substrate of claim 5, wherein the number of the through-conductive portions included in each of the first groups and the number of the through-conductive portions included in each of the second groups are equal to each other.

\* \* \* \* \*